US006530734B2

(12) United States Patent
Nering

(10) Patent No.: US 6,530,734 B2
(45) Date of Patent: Mar. 11, 2003

(54) METHODS AND APPARATUS FOR POSITIVE WAFER PROCESS STATUS IDENTIFICATION DURING SEMICONDUCTOR WAFER PROCESSING

(75) Inventor: Eric A. Nering, Modesto, CA (US)

(73) Assignee: Adept Technology, Inc., San Jose, CA (US)

( * ) Notice: Subject to any disclaimer, the term of this patent is extended or adjusted under 35 U.S.C. 154(b) by 0 days.

(21) Appl. No.: 09/732,010

(22) Filed: Dec. 8, 2000

(65) Prior Publication Data

US 2002/0071750 A1 Jun. 13, 2002

(51) Int. Cl.⁷ .................................................. B65D 3/16
(52) U.S. Cl. .................. 414/222.02; 414/940; 414/787
(58) Field of Search ................................ 116/327, 303; 414/222.01, 222.02, 222.13, 935, 937, 217, 940, 787

(56) References Cited

U.S. PATENT DOCUMENTS

| | | | | | |
|---|---|---|---|---|---|
| 4,498,668 A | * | 2/1985 | Bowen | ........................ | 116/225 |
| 4,926,786 A | * | 5/1990 | White | ........................... | 116/2 |
| 5,388,945 A | * | 2/1995 | Garric et al. | ............. | 414/217.1 |
| 5,778,818 A | * | 7/1998 | Marshall | ..................... | 116/309 |
| 5,884,392 A | * | 3/1999 | Lafond | ......................... | 29/722 |
| 6,014,942 A | * | 1/2000 | Perka et al. | ................. | 116/173 |
| 6,018,688 A | * | 1/2000 | Hashimoto | ................... | 438/51 |
| 6,050,214 A | * | 4/2000 | OKeefe | ....................... | 116/307 |
| 6,142,722 A | * | 11/2000 | Genov et al. | ................ | 414/217 |

* cited by examiner

Primary Examiner—Kathy Matecki
Assistant Examiner—Charles Fox
(74) Attorney, Agent, or Firm—Oliff & Berridge, PLC

(57) ABSTRACT

The processing status of a plurality of semiconductor wafers undergoing processing is positively identified by the use of indicator flags associated with cassettes containing the wafers. The flags are moved between at least two processing state indicating positions during processing of the wafers by a robotic arm that also transfers the wafers between the cassettes and a wafer processing station.

18 Claims, 4 Drawing Sheets

METHODS AND APPARATUS FOR POSITIVE WAFER PROCESS STATUS IDENTIFICATION DURING SEMICONDUCTOR WAFER PROCESSING

BACKGROUND OF THE INVENTION

1. Field of Invention

This invention relates to methods and apparatus for semiconductor wafer processing and manufacture of microcircuit devices, and more particularly to methods and apparatus for positively identifying the processing status of a plurality of semiconductor wafers that are being processed using multi-wafer cassettes as a transport method.

2. Background and Description of Related Art

As is well known, in semiconductor wafer processing, a semiconductor wafer is treated in a number of processing steps to form a plurality of micro-circuit devices on the wafer. Typically, such processing includes successive steps of chemically treating the semiconductor wafer, applying a photosensitive coating to the substrate surface, imaging a circuit pattern onto the substrate coating at a plurality of locations on the substrate using lithography equipment or the like, treating the exposed coating and then repeating the foregoing steps to build up the micro-circuit devices. Such processing treatment further includes, for example, solder printing processing to form electrical connections on the respective micro-circuit devices formed on the substrate. In order to produce micro-circuit devices in volume, large scale production facilities process hundreds of wafers during such processing. Conventional semiconductor wafer processing systems electronically track the process status with computer system controllers and displays that provide the operator with limited status messages, for example, cassette A, wafer no. 15. However, in the event of a power outage, emergency power-off or system malfunction, the process status information may be lost or corrupted, so that when restarting the system, it is not readily possible to determine the processing state of the various wafers in a cassette, or full cassettes of wafers.

SUMMARY OF THE INVENTION

The methods and apparatus of the present invention overcome the problems of the prior art and improve the manufacture of micro-circuit devices by providing positive wafer process status identification during semiconductor wafer processing in which a robotic arm moves wafers between a storage cassette located on a cassette holding station and a wafer processing station. The system comprises a mechanical indicator flag movable between at least two, and preferably at least three, processing state indicating positions; and an actuator member connected to the indicator flag and actuated by movement of the robot arm to move the indicator flag. The robot is controlled to move the indicator flag to different processing state indicating positions via the actuator member during the processing according to the stage of the processing and the sensed position of the indicator flag.

The wafer process status identification system of the present invention provides a positive, i.e., fool-proof, indication of the processing state of each wafer cassette during the semiconductor wafer processing that allows an operator to immediately determine which cassette or cassettes are finished, which are partially processed and which are awaiting processing. Costs attributed to system status uncertainty during error recovery are reduced, and production efficiency is improved. These and other features and advantages of the invention are described in or are apparent from the following detailed description of the preferred embodiments.

BRIEF DESCRIPTION OF THE DRAWINGS

The preferred embodiments of this invention will be described in detail with reference to the following figures, in which like numerals reference like elements, and wherein.

DETAILED DESCRIPTION OF PREFERRED EMBODIMENTS

Figure 1:
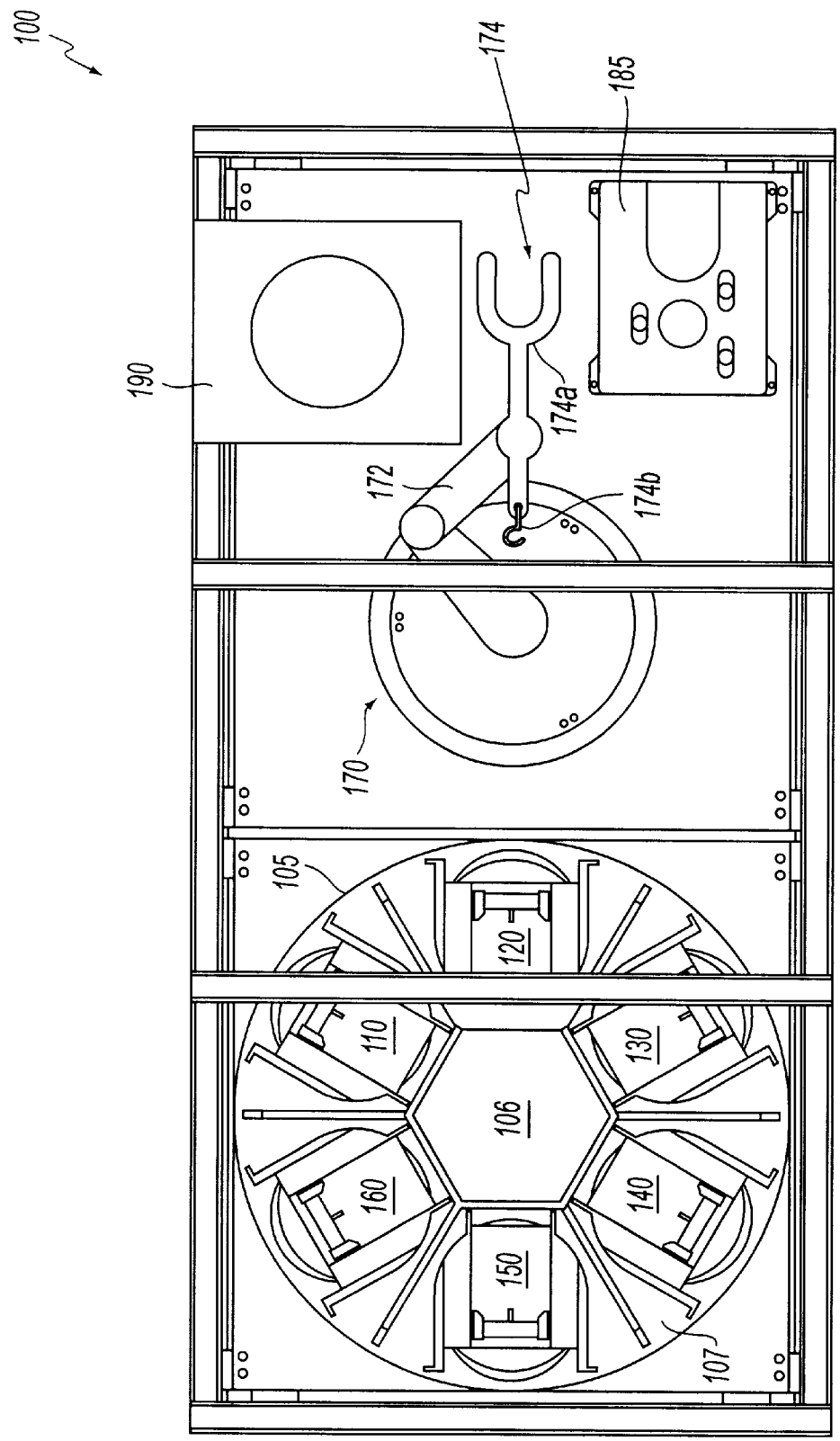
FIG. 1 is a plan view of a portion of an exemplary wafer processing system with which the present invention is used.

Referring to FIG. 1, the positive wafer processing status identification methods and apparatus of the present invention are adapted for use with a conventional wafer processing system 100 comprising at least one wafer cassette holding station or carousel 105 that holds, on a support surface or table 107, a plurality of, for example, six, separate wafer cassettes 110, 120, 130, 140, 150 and 160. System 100 further comprises a robotic transfer device 170 and process stations 185 and 190. Process station 185 may be, for example, a centering or pre-alignment station, and station 190 may be a transfer station for loading wafers into a process chamber. The robotic transfer device 170 comprises an articulated arm 172 that terminates in an end effector 174. End effector 174 advantageously has a first end 174a adapted for manipulating wafers, and a second end 174b adapted to cooperate with apparatus 200 described below. Articulated arm 172 and end effector 174 have multiple degrees of movement freedom, and arm 172 and end effector 174 are controlled to successively transfer wafers stacked in a cassette located in a transfer position on the carousel 105 between the cassette and the (respective) wafer processing station(s). System 100 and the various components thereof are controlled by one or more controllers (not shown) that also perform various monitoring functions that provide information indicative of the current status of the processing. Typically, the system controllers process this information and generate status and/or alarm messages that are displayed or printed for viewing by a system operator.

Figure 2:
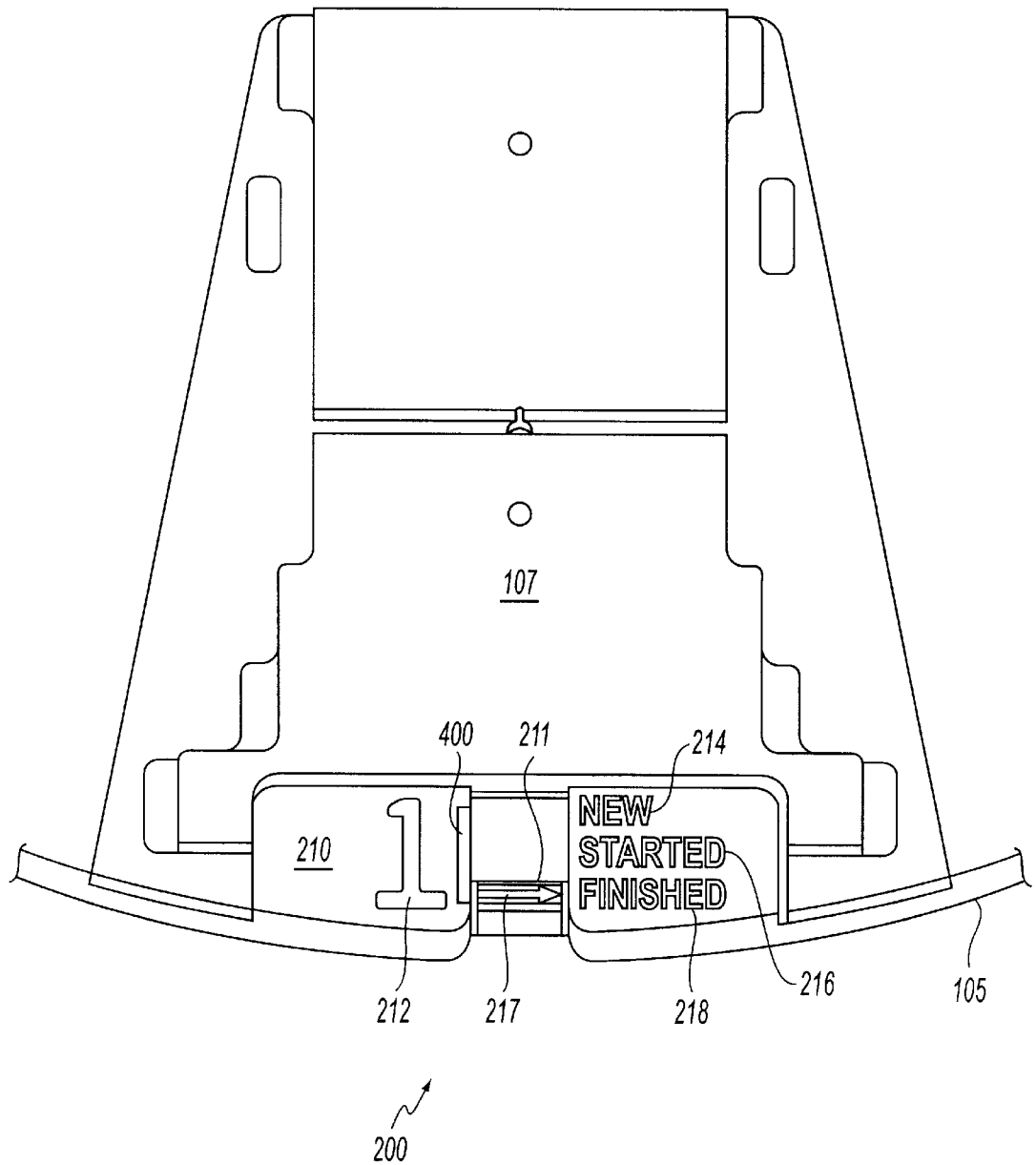
FIG. 2 is a top perspective view of one embodiment of wafer process status indicating apparatus according to the present invention.
Figure 3A:
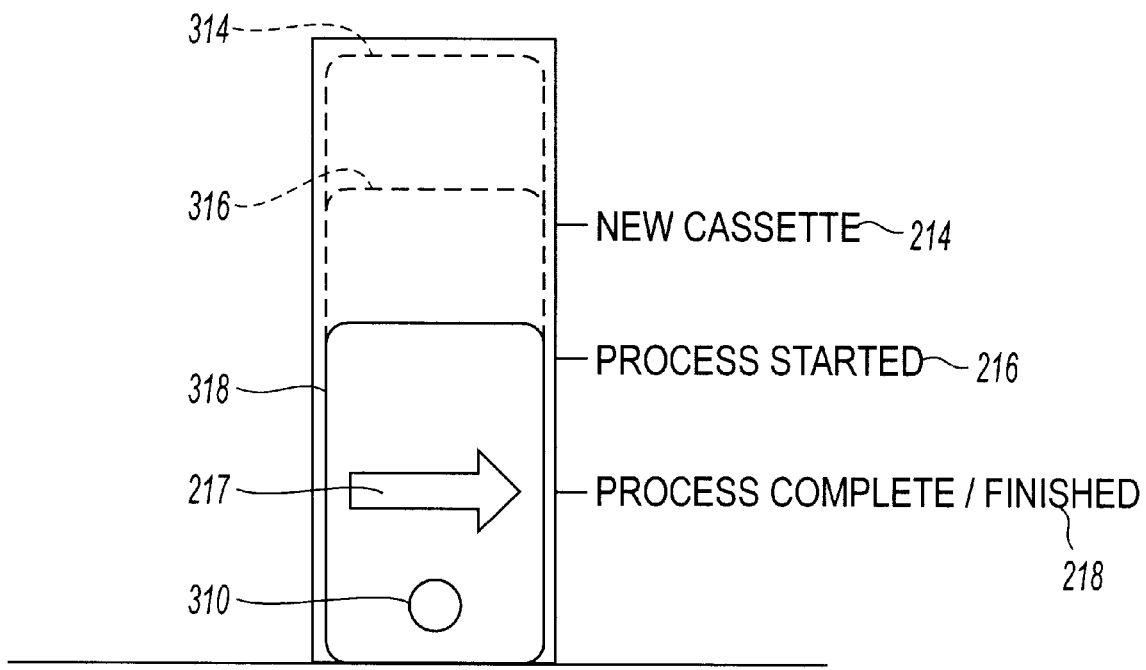
FIGS. 3a and 3b are a partial top view and a partial end elevation view, respectively, of a modified version of the embodiment of FIG. 2.
Figure 3B:
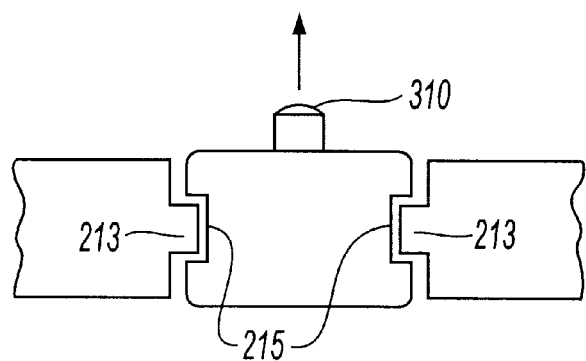

Referring to FIG. 2, one embodiment of apparatus 200 according to the present invention for providing a positive identification of the processing status of a wafer comprises a semaphore or flag member 211 mounted relative to a support 210 so as to be movable between at least two, and preferably at least three positions respectively indicating different processing states of wafers in an associated cassette. Three positions, for example, can be used to indicate, respectively that processing of the wafers in a cassette i) has not yet started, ii) has started, or iii) has finished. In the illustrated embodiment, flag member 211 is slidably mounted with respect to support 210 so that member 211 is linearly displaced. Alternatively, flag member 211 can be pivotally mounted with respect to support 210 to rotate between different angular orientations or positions indicating different processing states. Advantageously, as shown in FIGS. 2–3b, support 210 defines a slot in which flag member 211 is slidingly received. The opposite side walls of the support slot are configured to define projecting guide rails 213 that cooperate with recessed tracks 215 formed in the opposing side walls of flag member 211. Apparatus 200 further comprises spring biasing (not shown) to bias flag member 211 toward one of the processing state indicating positions, and support 210 is configured with detents or the like (not shown) to releasably retain flag member 211 at the other processing state indicating positions when flag member 211 is moved to those positions.

As shown, support 210 advantageously is formed as an integral part of carousel table 107. Alternatively, support 210 is configured as a frame that is attached to carousel table 107 and in which flag 211 is mounted. Support 210 includes a region on which a cassette identifying indicia 212 is displayed, e.g., a numeral as shown, and regions associated with each of the processing state indicating positions of the flag member 211 on which different process state identifying indicia 214, 216 and 218 are respectively displayed. Flag member 211 advantageously is also provided with a pointer or other indicia 217, as shown. Illustrative indicia 214, 216, and 218 for the illustrated three position embodiment are "NEW," "STARTED," and "FINISHED" or "COMPLETE". Advantageously, as shown, the NEW, STARTED and FINISHED positions are arranged so that the NEW position is the radially innermost position, and the FINISHED position is the radially outermost position. It will be appreciated that apparatus 200 can be configured to include an additional flag member movable between a plurality of processing state indicating positions to identify which of the wafers in a cassette is currently being processed. Alternatively, a single flag member could be used having sufficient processing state indicating positions to indicate both the processing state of the entire cassette and which wafer in the cassette is currently being processed.

As shown in FIGS. 2 and 3, support 210 is located at the outer peripheral edge of the cassette supporting carousel table 107 adjacent the location where a cassette sits when loaded on the carousel. A separate support and flag member arrangement is mounted at each cassette location on the carousel. Alternatively, the support and flag member arrangement could be disposed on each cassette, or elsewhere on the carousel table as may be convenient. Support 210 can be disposed either vertically or horizontally with respect to the carousel table 107 supporting surface, so that, for example, a slidingly mounted flag member 211 is movable either relatively vertically between a vertically uppermost and a vertically lowermost processing state indicating position, or, as shown, relatively horizontally between a radially outermost and a radially innermost processing state indicating position.

Apparatus 200 further comprises actuator apparatus 300 connected to the flag member 211 so as to be actuated manually by an operator, or automatically by movement of the robot arm 172 to move the flag member 211 between its respective processing state indicating positions. As shown in the FIGS. 3a–3b embodiment, actuator apparatus 300 comprises, for example, an upstanding post 310 on the flag member. With a vertically oriented support member 210, post 310 advantageously projects outwardly from the face of support member 210 facing the robot arm 172, so that simple z-axis movement of the robot arm in contact with post 310 displaces flag member 211 upwardly or downwardly. With a horizontally oriented support member, post 310 advantageously projects from either the upper or the lower face of flag member 310, so that movement of the robot arm to move the end effector 174b in a radial direction relative to carousel 105 in contact with post 310 displaces flag member 211 inwardly or outwardly. Alternatively, as shown in the FIG. 2 embodiment, indicia 217 on flag member 211 can be formed on a raised portion of flag member 211 so as to be engageable by end effector 174b, and thereby constitute the actuator apparatus. It will be appreciated that more complicated actuator apparatus that is responsive to controlled movement of the robot arm can be used. Such actuator apparatus can have, for example, multiple linkages, and/or gear/cam arrangements.

Apparatus 200 advantageously further comprises sensor apparatus 400 (schematically shown in FIG. 2) connected to the processing system or robotic controller for determining the processing state indicating position of flag member 211. Apparatus 400 advantageously comprises contact sensors, such as micro-switches or the like, or non-contact sensor(s) associated with or mounted on support member 210, or a machine vision system associated with robotic transfer device 170.

Figure 4:
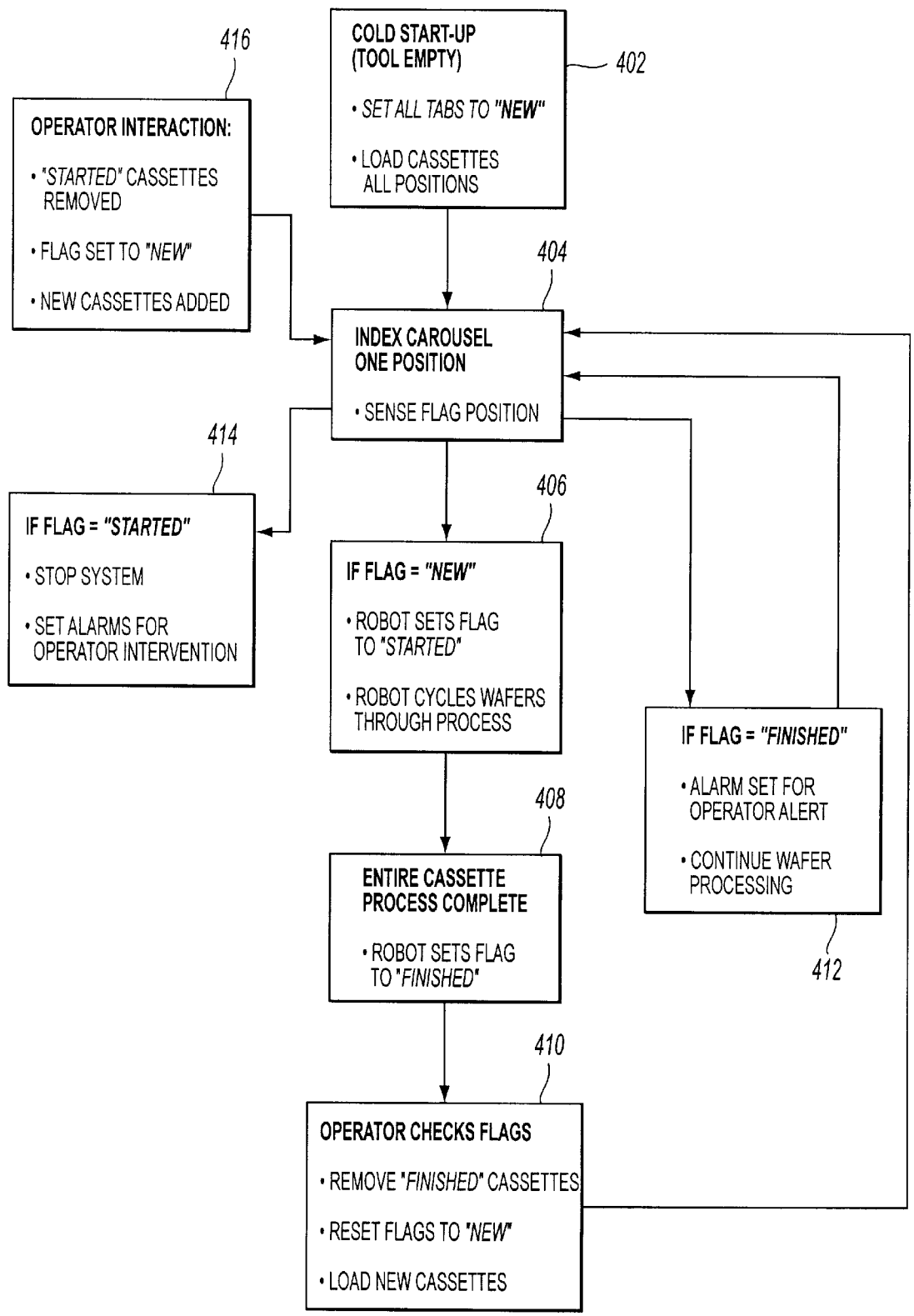
FIG. 4 is a flowchart showing the operation of one embodiment of a positive wafer process status identification system according to the present invention.

Operation of apparatus 200 in accordance with the invention will be described with reference to FIG. 4, which illustrates the operating cycle of a portion of an exemplary wafer processing system, including the initial, or "cold," start-up, with a cassette carousel empty. At initial start-up (step 402), wafer cassettes to be processed are loaded on the carousel table 107 at all cassette positions, and all of the associated flag members 211 are set to the NEW processing state indicating position, either manually or by controlling robot arm 172. Preferably, apparatus 200 is configured so that flag members 211 are only set to the NEW processing state position manually by the operator, and the robot arm 172 is used to move the flag members only from the NEW position to the other positions. The carousel is then rotated or indexed by one cassette position, and the processing state indicating position of the associated flag member 211 is then sensed (step 404).

During the first pass through the operating cycle, assuming all of the flag members 211 were correctly set to NEW in step 402, step 406 is then performed. In step 406, robot arm 172 is first controlled to move the associated flag member 211 to the STARTED processing state indicating position, and then the robot arm 172 is then automatically controlled to cycle the wafers in the cassette through predetermined wafer processing by transferring successive wafers in the cassette between the cassette and the associated processing station(s). (If the apparatus 200 is configured to also track the processing state of each wafer in a cassette, then the robot arm 172 is controlled, prior to removing the next wafer in a cassette for processing, to move the appropriate flag member to the next position indicating which wafer is being processed.)

When all of the wafers in a cassette have been processed, the robot arm 172 is controlled to move the associated flag member 211 to the FINISHED processing state indicating position (step 408). During the wafer processing, the operator in step 410 periodically checks the positions of the various flag members 211, and removes cassettes for which the associated flag member 211 is in the FINISHED position. The operator then resets the flag members for the empty carousel cassette positions to the NEW position and loads new cassettes in the carousel at these cassette positions. It will be appreciated that it is not necessary for step 410 to be performed in synchronization with, or at any particular time relative to, the other steps.

The cycle then returns to step 404, where the carousel is indexed to the next cassette position, and the position of the associated flag member 211 is read. If the processing state indicating position of the flag member 211 for the next carousel position is other than NEW, then step 406 is not performed next. Instead, if the flag member is in the FINISHED position, step 412 is performed, wherein an alarm is set to alert the operator to replace the finished cassette, and the process returns to step 404, resulting in the carousel being again indexed to the next cassette position and the position of the associated flag member 211 being read. If, during step 404, the flag member is sensed to be in the STARTED position (which can result from a system malfunction, emergency shut-down or the like), then step 414 is performed. In step 414, the wafer processing system is temporarily halted or suspended, and alarms are set notifying the operator that operator intervention is required. In response, the operator, in step 416, removes the STARTED cassette(s) and sets the associated flag member (s) to the NEW position. The operator then commands the system controller to resume the wafer processing, which causes step 404 to be repeated.

It will be understood that the invention has been described with respect to specific embodiments thereof that are intended to be illustrative, not limiting, and that modifications may be made without departing from the spirit and scope of the invention.

What is claimed is:

1. Apparatus for positively identifying the processing status of a plurality of semiconductor wafers associated with a storage cassette used in a processing system comprising a controllable robot arm for transferring wafers between a cassette located on a cassette holding station and a wafer processing station, the apparatus comprising:
    at least one indicator flag movable between at least two processing state indicating positions; and
    an actuator member connected to the at least one indicator flag and actuated by movement of the robot arm to move the indicator flag.

2. The apparatus of claim 1 wherein the actuator member is joined to the indicator flag so that a linear movement of the robot arm in a radial direction relative to the cassette moves the indicator flag between the at least two processing state indicating positions.

3. The apparatus of claim 1 wherein the actuator member is joined to the indicator flag so that a relatively vertical movement of the robot arm relative to the cassette moves the indicator between the at least two processing state indicating positions.

4. The apparatus of claim 3 wherein the indicator flag is movable relatively vertically and the actuator member is a post that projects from the indicator flag in a relatively horizontal direction.

5. The apparatus of claim 1 further comprising a frame mountable on the cassette holding station in which the indicator flag is slidably mounted.

6. The apparatus of claim 5 wherein the indicator flag includes a base portion that slidingly engages at least one slot formed in the frame.

7. The apparatus of claim 6 wherein the indicator flag base portion and the slot define a cooperating recessed track and a projecting rail for guiding the sliding movement of the indicator flag.

8. The apparatus of claim 1 further comprising a display operatively associated with the indicator flag that provides visually observable descriptions of the processing state associated with each of the at least two processing state indicating positions.

9. The apparatus of claim 8 wherein the indicator flag is movable between three processing state indicating positions that are disposed vertically relative to each other, and that indicate, respectively, a new cassette, processing started and processing finished processing states.

10. The apparatus of claim 9 comprising a sensor that automatically senses the position of the indicator flag and produces an output signal indicative of the sensed position.

11. The apparatus of claim 4 wherein the post is disposed such that the robot arm does not engage the post while the robot arm transfers a wafer between the cassette and the wafer processing station, and the actuator member is only actuated responsive to separate actuating movements of the robot arm.

12. Apparatus for positively identifying the processing status of a plurality of semiconductor wafers during processing in a processing system for processing of semiconductor wafers wherein a plurality of wafers are stored in a storage cassette, a plurality of cassettes are located on a cassette holding station that moves the cassettes successively into a transfer position relative to a controllable robot arm that successively transfers individual wafers between a cassette located at the transfer position and a wafer processing station, the process status identifying apparatus comprising:
    an indicator flag that is associated with each position on the cassette holding station where cassettes can be located, and that is movable between at least two processing state indicating positions; and
    an actuator member connected to each indicator flag and actuated by movement of the robot arm to move the indicator flag.

13. The apparatus of claim 12 wherein the cassette holding station includes at least one rotatable support carousel on which a plurality of cassettes are disposed in a circular arrangement, and the indicator flags are arranged around the outer periphery of the carousel in relative alignment with the respective locations at which cassettes are disposed.

14. A method for positively identifying the processing status of a plurality of semiconductor wafers during processing in a processing system for processing of semiconductor wafers wherein a plurality of wafers are stored in a storage cassette, a plurality of cassettes are located on a cassette holding station that moves the cassettes successively into a transfer position relative to a controllable robot arm that is controllable to operate in a wafer transfer cycle of operation so as to successively transfer individual wafers between a cassette located at the transfer position and a wafer processing station, the method comprising:
    providing an indicator flag that is associated with each position on the cassette holding station where cassettes can be located, and that is movable between at least two processing state indicating positions; and
    providing an actuator member connected to each indicator flag and actuated by movement of the robot arm to move the indicator flag.

15. The method of claim 14 further comprising:
    prior to initiating the wafer transfer cycle, sensing the position of the indicator flag associated with the cassette located at the transfer position of the cassette holding station;
    if the indicator flag is sensed to be at a first position indicative of a new cassette that has not been processed:
        controlling the robot arm to move the indicator flag to a second position indicative that the cassette wafers are being processed, initiating the wafer transfer cycle to successively transfer the wafers in the cassette between the cassette and the wafer processing station, and at the completion of the wafer transfer cycle, controlling the robot arm to move the indicator flag to a third position indicative that processing of the cassette wafers has been completed.

16. The method of claim 15 further comprising:

if the indicator flag is sensed to be at the second position, suspending operation of the processing system and alerting a system operator to intervene; and if the indicator flag is sensed to be at the third position:
alerting the system operator of the condition,
operating the cassette holding station to move the next cassette to the transfer position, and
repeating the sensing step.

17. In a method of making micro-circuit devices by processing semiconductor wafers in a processing system wherein during at least part of the processing a plurality of wafers are stored in a storage cassette, a plurality of cassettes are located on a cassette holding station that moves the cassettes successively into a transfer position relative to a controllable robot arm that is controllable to operate in a wafer transfer cycle of operation so as to successively transfer individual wafers between a cassette located at the transfer position and a wafer processing station, the steps of:

providing an indicator flag that is associated with each position on the cassette holding station where cassettes can be located, and that is movable between at least two processing state indicating positions; and providing an actuator member connected to each indicator flag and actuated by movement of the robot arm to move the indicator flag.

18. A micro-circuit device made by the method of claim 17.

* * * * *